(12) United States Patent
Stubbs et al.

(10) Patent No.: US 6,898,144 B2
(45) Date of Patent: May 24, 2005

(54) ACTIVELY DRIVEN VREF FOR INPUT BUFFER NOISE IMMUNITY

(75) Inventors: Eric T. Stubbs, Boise, ID (US); James E. Miller, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/624,772

(22) Filed: Jul. 22, 2003

(65) Prior Publication Data

US 2004/0120205 A1 Jun. 24, 2004

Related U.S. Application Data

(63) Continuation of application No. 09/759,499, filed on Jan. 12, 2001, now Pat. No. 6,597,619.

(51) Int. Cl.[7] .................................................. G11C 7/00
(52) U.S. Cl. ............. 365/226; 365/185.21; 365/189.07; 365/206; 365/207
(58) Field of Search ........................... 365/226, 185.21, 365/189.07, 206, 207

(56) References Cited

U.S. PATENT DOCUMENTS

| | | | |
|---|---|---|---|
| 4,006,400 A | 2/1977 | Fett et al. | |
| 4,110,677 A | 8/1978 | Boronkay et al. | |
| 4,270,090 A | 5/1981 | Williams et al. | |
| 4,399,398 A | 8/1983 | Wittlinger | |
| 4,477,736 A | 10/1984 | Onishi | |
| 4,559,488 A | 12/1985 | Minakuchi | |
| 4,714,845 A | 12/1987 | Devecchi et al. | |
| 5,212,440 A | 5/1993 | Waller | |
| 5,444,663 A * | 8/1995 | Furuno et al. | ............... 365/226 |
| 5,453,713 A | 9/1995 | Partovi et al. | |
| 5,481,179 A | 1/1996 | Keeth | |
| 5,721,702 A | 2/1998 | Briner | |
| 5,796,295 A | 8/1998 | Sharpe-Geisler | |
| 5,892,402 A | 4/1999 | Tsubaki et al. | |
| 5,973,897 A | 10/1999 | Opris et al. | |
| 6,124,704 A * | 9/2000 | Annema | ...................... 323/313 |
| 6,236,195 B1 | 5/2001 | Nagatomo | |
| 6,294,941 B1 | 9/2001 | Yokosawa | |
| 6,339,357 B1 | 1/2002 | Yamasaki et al. | |
| 6,396,336 B2 | 5/2002 | Roberts et al. | |

* cited by examiner

Primary Examiner—Connie C. Yoha
(74) Attorney, Agent, or Firm—TraskBritt

(57) ABSTRACT

A memory device including a circuit for actively driving a reference voltage in a memory device is disclosed. A circuit integrated in a memory device and coupled to an external voltage source substantially eliminates fluctuations in the reference voltage of the memory device caused by power supply changes and noise occurring in the memory device by generating a constant voltage and good current drive from the external voltage source.

8 Claims, 3 Drawing Sheets

ACTIVELY DRIVEN VREF FOR INPUT BUFFER NOISE IMMUNITY

CROSS-REFERENCE TO RELATED APPLICATION

This application is a continuation of application Ser. No. 09/759,499, filed Jan. 12, 2001, now U.S. Pat. No. 6,597,619, issued Jul. 22, 2003.

BACKGROUND OF THE INVENTION

1. Field of the Invention

This invention generally relates to a method and apparatus for improving reference voltage stability in semiconductor devices. More specifically, the invention involves the integration of a circuit using a voltage reference to generate a constant voltage with a semiconductor device to actively drive a reference voltage in the device.

2. State of the Art

Semiconductor devices such as logic chips, processors, and memory devices commonly employ at least one voltage reference signal ("$V_{REF}$") for testing and operation. Use of a $V_{REF}$ signal in semiconductor devices is well known in the art. Problems associated with $V_{REF}$ stability caused by variances in a $V_{REF}$ source or noise on the semiconductor device are also well known. For example, a reference voltage generating circuit incorporated into a memory device (e.g. DRAM, SDRAM, or flash memory) generates $V_{REF}$ from a power supply voltage supplied to the memory device. Variations in the power supply voltage are translated to variations in $V_{REF}$. These variations may cause the memory device to operate defectively. Likewise, noise from other signals on the memory device may also cause variations in the generated $V_{REF}$ resulting in similar operational defects.

In other memory devices, such as Rambus and double data rate (DDR) memory, a $V_{REF}$ signal is bused to the device rather than being generated on the device. The bused $V_{REF}$ is subject to the same noise and signal variations as a $V_{REF}$ generated on the device. This results in an equal propensity for operational defects due to $V_{REF}$ fluctuations.

The use of a $V_{REF}$ signal with a semiconductor device is best explained with reference to an example. FIG. 5 is a simplified block diagram illustrating the workings of a memory device 500 such as an SDRAM as known in the art. The memory device 500 includes an address register 510, row address controls 520, column address controls 530, at least one memory array 540, data input/output controls 550, control logic 560 and a $V_{REF}$ generator 570. An external power supply provides a power supply voltage $V_{DD}$ to the memory device 500. To reduce the number of terminals on the memory device, a reference voltage ($V_{REF}$) is created from the power supply voltage $V_{DD}$ rather than from a power supply independent of that producing $V_{DD}$. $V_{DD}$ is introduced to the $V_{REF}$ generator 570 which generates a $V_{REF}$ signal having a desired voltage. For example, the $V_{REF}$ generator 570 may be a voltage divider which produces $V_{REF}$ having half of the voltage of $V_{DD}$. The generated $V_{REF}$ signal is routed to both the address register 510 and the data input/output controls 550 where it is used in the operation of the memory device 500.

A simplistic generalization of $V_{REF}$ operation in a memory device demonstrates some of the problems associated with varying $V_{REF}$ signals. The $V_{REF}$ signal generated from $V_{DD}$ by the $V_{REF}$ generator 570 has a voltage which is approximately half of the power supply voltage $V_{DD}$ applied to the memory device 500. A signal, such as an address signal corresponding to a memory cell location in the memory array 540, received by the memory device 500 at the address register 510, is compared to $V_{REF}$. If the signal has a voltage which is higher than $V_{REF}$, then the signal is high and corresponds to a logical value of one. If the signal has a voltage lower than $V_{REF}$, then the signal is low, having a logical value of zero. In this manner, received signals may be compared to $V_{REF}$ and assigned values which define memory locations within the memory array 540. Similarly, data read from or written to the memory device 500 is compared to $V_{REF}$ to establish whether each data bit is high or low.

Because $V_{REF}$ is usually generated from the power supply voltage $V_{DD}$, variances in the power supply voltage $V_{DD}$ cause fluctuations in $V_{REF}$. If the variance is great enough to drive $V_{REF}$ closer to the power supply voltage $V_{DD}$, a signal received by the memory device 500 which normally would have been defined as high may, instead, be mischaracterized as low. The altered characterization of the signal results in a malfunction of the memory device 500. Similarly, noise created by other circuits and power supplies on the memory device may also cause variances in $V_{DD}$ which in turn cause variances in $V_{REF}$ resulting in the mischaracterization of signals received by the memory device.

To reduce the problems associated with $V_{REF}$ variations in semiconductor devices, integrated circuits and memory devices, numerous $V_{REF}$ regulation circuits have been devised to aid in stabilizing $V_{REF}$. These circuits may be separate from, or coincidental with, the $V_{REF}$ generation circuits for the integrated circuits. One example of a circuit designed to compensate for variation in $V_{REF}$ involves the addition of decoupling capacitors between the power rails of an integrated circuit. The capacitors help eliminate stray capacitance, thereby reducing the amount of noise within the memory device. Similarly, resistive decoupling of noisy nodes within a memory device eliminates noise at the noisy node but enhances noise elsewhere in the circuit. Likewise, diodes are used to reduce the amount of noise in such circuits. Other examples of stabilized $V_{REF}$ generation circuits are described in U.S. Pat. Nos. 5,212,440 and 4,477,736, the disclosures of each of which are hereby incorporated herein by reference. However, these circuits do not eliminate all of the noise in $V_{REF}$.

Although a number of $V_{REF}$ regulation circuits have been described and used with memory devices and other semiconductor devices, problems caused by noise within the device and by fluctuations in power supplies remain. Furthermore, these problems seem to be accentuated in high speed memory devices and other semiconductor devices operating at ever lower voltages. Therefore, it is desirous to provide a $V_{REF}$ to a semiconductor device which is not as susceptible to power supply fluctuations or noise from the circuits in the semiconductor device.

BRIEF SUMMARY OF THE INVENTION

The present invention generally relates to an apparatus for improving reference voltage stability in semiconductor devices. More specifically, the invention involves the integration of a circuit using $V_{REF}$ as a reference to generate a constant voltage in a semiconductor device to actively drive a reference voltage ($V_{REF}$) within the memory device. It is understood that, while the present invention may be incorporated with any semiconductor device having need for a $V_{REF}$ signal the present invention will be described in reference to memory device.

According to the present invention, a $V_{REF}$ signal is actively driven on a memory device by coupling an external $V_{REF}$ signal to a circuit capable of generating a constant voltage and active current drive which is integrated with the memory device. For example, employing the combination of an external $V_{REF}$ signal with a voltage follower, a $V_{REF}$ current source substantially close to a constant voltage may be driven within the memory device. Unlike the $V_{REF}$ generated by $V_{REF}$ generators incorporated with semiconductor devices of the prior art, the $V_{REF}$ created by the voltage follower circuit is not subject to fluctuations due to changes in the power supply voltage $V_{DD}$ of the memory device because $V_{REF}$ is driven by an independent, external input voltage. Likewise, the substantially constant voltage driven by the voltage follower reduces the effects of coupling in the memory device and eliminates $V_{REF}$ fluctuations caused by noise in the memory device. Furthermore, the active current drive capability of the voltage follower circuit allows quick responses to other signals coupling $V_{REF}$ or causing fluctuations in $V_{REF}$.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

Illustrated in FIGS. 1 through 4 are different embodiments of the present invention. It is understood that the figures presented in conjunction with this description are not meant to be actual, scaled, representations of the present invention. Instead, FIGS. 1 through 4 exemplify idealized representations of the present invention, employed to more clearly and fully depict the present invention.

Figure 1:
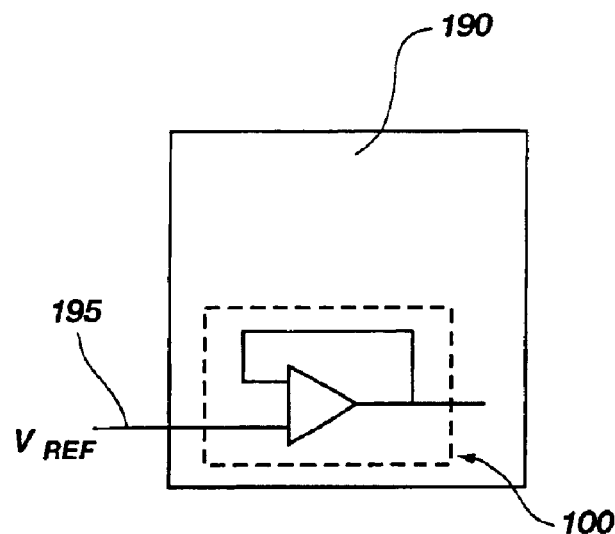
FIG. 1 is a block diagram of a preferred embodiment of the present invention.

FIG. 1 illustrates a general diagram of a preferred embodiment of the present invention: a voltage follower circuit 100 integrated with a semiconductor device 190. The voltage follower circuit 100, delineated by broken lines, is coupled to a $V_{REF}$ source 195 external to the semiconductor device 190.

Figure 2:
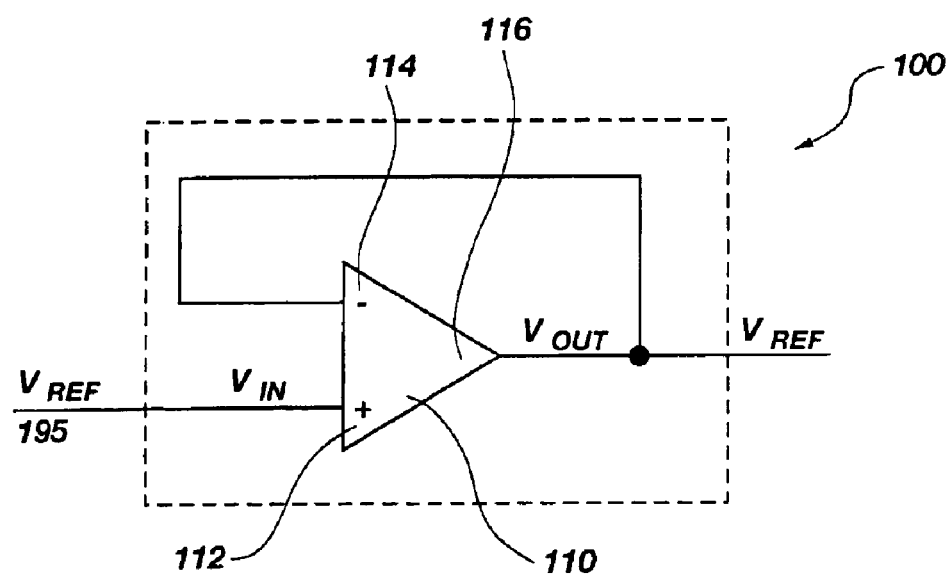
FIG. 2 is a circuit diagram of a voltage follower circuit as used in the present invention.

The voltage follower circuit 100 of FIG. 1 is illustrated in more detail in FIG. 2. As depicted, the voltage follower circuit 100 is delineated by broken lines and includes an operational amplifier 110 having two inputs and an output. A first input, commonly known as a non-inverting input 112, couples a voltage signal $V_{IN}$ to the amplifier 110. The second input, also known as the inverting input 114, is coupled to the output 116 of the amplifier 110. Thus, the inverting input 114 receives a voltage signal $V_{OUT}$.

The voltage follower circuit 100 illustrated in FIG. 2 is well known in the art. The voltage $V_{IN}$ applied to the non-inverting input 112 produces a voltage $V_{OUT}$ which is coupled to the inverting input 114, producing a second input to the voltage follower circuit of $V_{OUT}$. Voltage follower circuits such as that illustrated in FIG. 2 actively drive $V_{OUT}$ equal to $V_{IN}$, thereby maintaining a substantially constant voltage $V_{OUT}$.

In this embodiment of the present invention, the non-inverting input 112 of the voltage follower circuit 100 is coupled to a $V_{REF}$ source 195 external to the semiconductor device 190. Therefore, $V_{IN}$ is equal to the $V_{REF}$ source 195. Coupled with $V_{OUT}$, the voltage follower circuit 100 generates a $V_{REF}$ for the semiconductor device 190 which is independent of the semiconductor device power supply (not shown). Thus, fluctuations in $V_{REF}$ due to power supply variations are eliminated. Additionally, the voltage follower circuit 100 generates a $V_{REF}$ having sufficient current to counter at least a portion of the capacitive coupling effects commonly found on the $V_{REF}$ line in semiconductor devices having noisy environments. The ability of the voltage follower circuit 100 to actively drive $V_{REF}$ in the semiconductor device 190 reduces fluctuations in $V_{REF}$ caused by noise and interference encountered by $V_{REF}$ within the semiconductor device 190.

Figure 3:
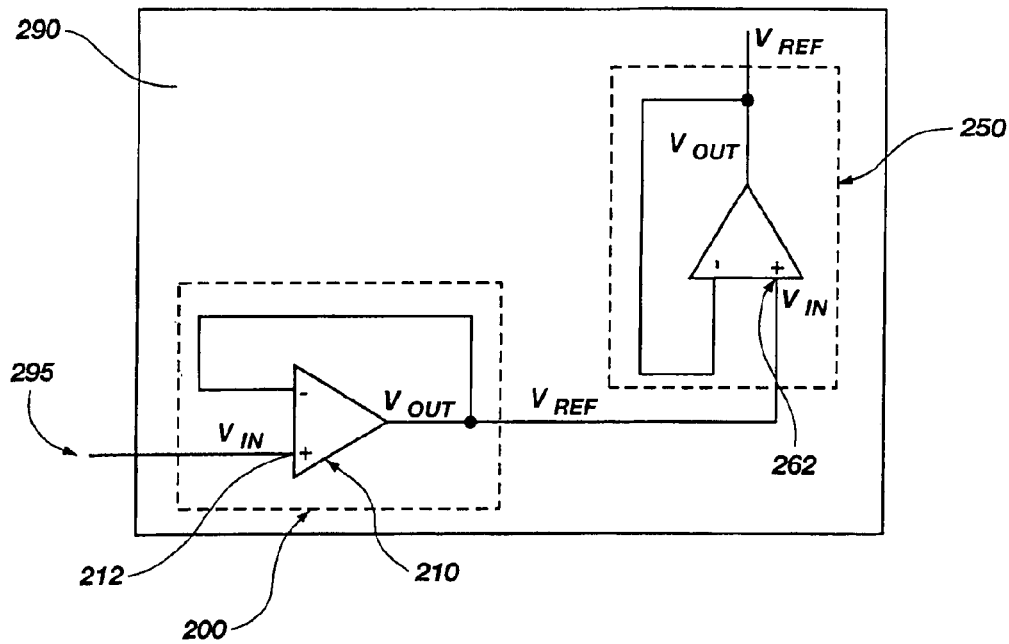
FIG. 3 is a block diagram of an additional embodiment of the present invention.

In another embodiment of the invention, multiple voltage follower circuits 100 are integrated with a semiconductor device along the $V_{REF}$ line, thereby assuring that the advantages of the voltage follower circuit 100 are realized with the $V_{REF}$ throughout the semiconductor device. For example, FIG. 3 illustrates a semiconductor device 290 having a first voltage follower circuit 200 and a second voltage follower circuit 250 integrated therein. A voltage source 295 external to the semiconductor device 290 is the non-inverted input 212 of the amplifier 210 of the first voltage follower circuit 200. $V_{OUT}$ is $V_{REF}$ for a first circuitry portion (not shown) of the semiconductor device 290. $V_{REF}$ exits the first circuitry portion of the semiconductor device 290 after having been exposed to the noise generated by the circuits therein. Although the $V_{REF}$ is driven by the first voltage follower circuit 200, a second voltage follower circuit 250 receives the $V_{REF}$ at the non-inverted input 262 of the second amplifier 260. The second voltage follower circuit 250 drives a second $V_{REF}$ to a second circuitry portion (not shown) of the semiconductor device 290. In this manner, the advantages of using a voltage follower circuit may be realized throughout the entire memory device.

It is further understood that the present invention is not limited to the use of one or two voltage follower circuits to drive $V_{REF}$ in a semiconductor device. A larger plurality of voltage follower circuits could be incorporated with the $V_{REF}$ signal in a semiconductor device in accordance with the present invention. Likewise, the present invention is not limited by the type or configuration of the voltage follower circuit or circuits integrated with the semiconductor device. Voltage follower circuits are well known in the art and one of ordinary skill in the art would understand how to integrate a chosen voltage follower circuit with the chosen semiconductor device. Furthermore, the present invention is not limited to the incorporation of voltage follower circuits with a semiconductor device. Any circuit that uses $V_{REF}$ as a reference to generate a substantially constant voltage and good current drive may be substituted for the voltage follower circuits described herein.

The present invention is not limited to particular semiconductor devices. The advantages realized by use of this invention may be incorporated into memory devices, including, for example, DRAM, SDRAM, Rambus memory, double data rate memory, flash memory, and other high speed memory devices, as well as logic chips, processors and other integrated circuit chips.

Figure 4:
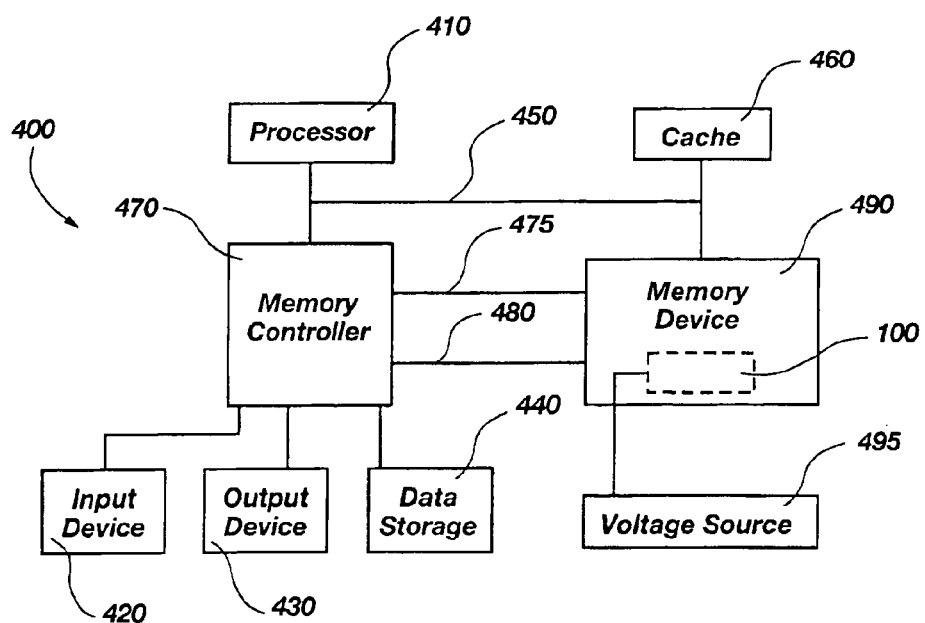
FIG. 4 is a block diagram of a computer system using a memory device of the present invention.
Figure 5:
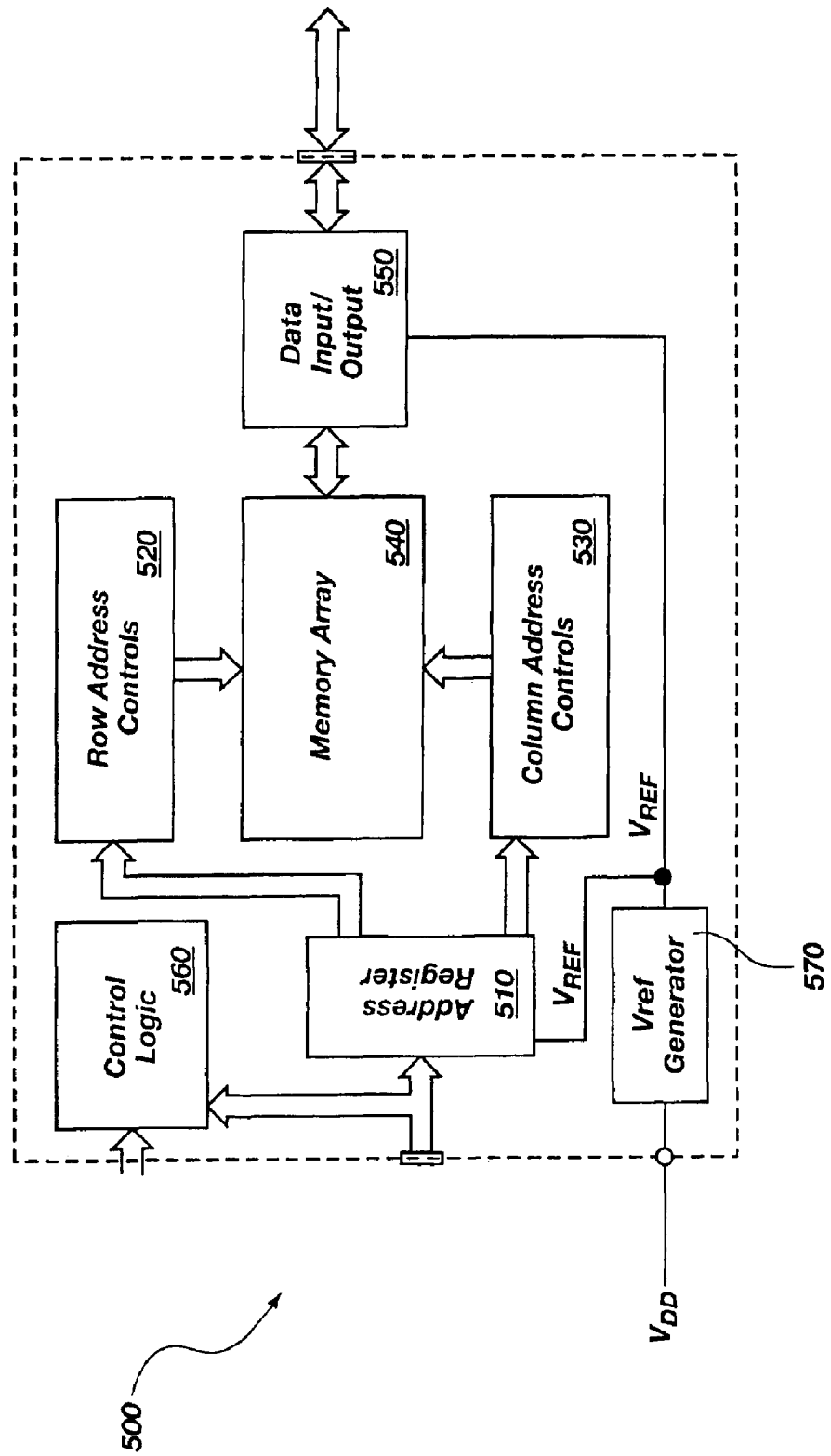
FIG. 5 is a simplified block diagram of a memory device of the prior art employing a $V_{REF}$ signal created from a power supply voltage.

FIG. 4 illustrates a block diagram of a computer system 400 that includes at least one memory device 490 incorporating the embodiments of the present invention as described with respect to FIGS. 1 through 3 above. As illustrated, the computer system 400 includes a processor 410 for performing computing functions as known in the art, one or more input devices 420 as known in the art, and one or more output devices 430. One or more data storage devices 440 may also be coupled to the computer system to allow the processor 410 to store or retrieve data. The processor 410 includes a processor bus 450 that includes an address bus, a control bus, and a data bus. The processor 410 is also coupled to a cache memory 460 and to the memory device 490 through a memory controller 470. A data bus is also coupled between the memory device 490 and the processor bus 450. The memory controller 470 includes a control bus 475 and an address bus 480 coupled to the memory device 490. A voltage source 495 is also coupled to the memory device 490 to provide a $V_{REF}$ to at least one circuit 100 integrated with the memory device 490 to generate a $V_{REF}$ on the device 490 having a constant voltage and a good current drive.

Having thus described certain preferred embodiments of the present invention, it is to be understood that the invention defined by the appended claims is not to be limited by particular details set forth in the above description, as many apparent variations thereof are possible without departing from the spirit or scope thereof as hereinafter claimed.

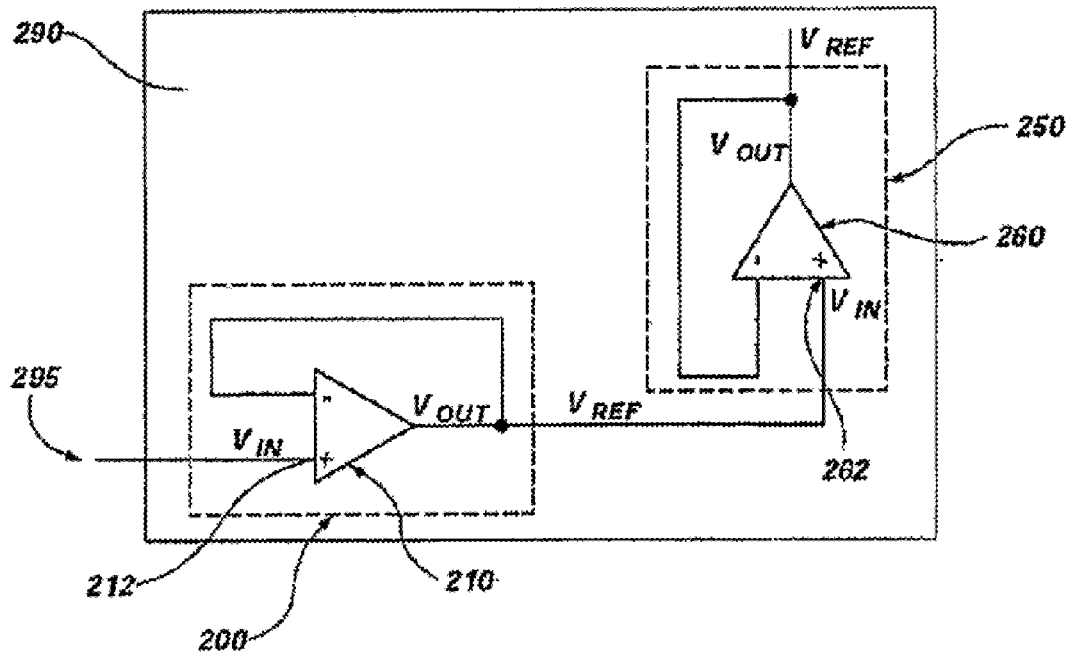

What is claimed is:

1. A memory device, comprising:
a memory array for storing at least one data bit and configured to electrically operate from a power supply voltage; and
a circuit configured to receive an external reference voltage as generated external to the memory device and generate in response thereto an internal reference voltage independent of the power supply voltage, the internal reference voltage for accessing and evaluating a logic state of the at least one data bit in the memory array.

2. The memory device of claim 1, further comprising data input/output circuitry coupled to the memory array and further coupled and responsive to the internal reference voltage of the circuit.

3. The memory device of claim 1, further comprising an address register coupled and responsive to the internal reference voltage of the circuit.

4. The memory device of claim 1, wherein the internal reference voltage generated by the circuit tracks follows the external reference voltage.

5. The memory device of claim 1, wherein the circuit comprises a following circuit configured to generate an internal reference voltage that is dependent upon the external reference voltage.

6. The memory device of claim 1, wherein the circuit comprises a voltage follower configured to receive the external reference voltage at an input and to generate in response thereto the internal reference voltage.

7. The memory device of claim 1, wherein the circuit comprises a plurality of voltage followers serially coupled to receive the external reference voltage and generate in response thereto the internal reference voltage.

8. The memory device of claim 1, further comprising circuitry for configuring the memory device as one of a DRAM, SDRAM, Rambus memory, double data rate memory and flash memory.

* * * * *

UNITED STATES PATENT AND TRADEMARK OFFICE
CERTIFICATE OF CORRECTION

| | | |
|---|---|---|
| PATENT NO. | : 6,898,144 B2 | |
| APPLICATION NO. | : 10/624772 | |
| DATED | : May 24, 2005 | |
| INVENTOR(S) | : Eric T. Stubbs and James E. Miller | |

It is certified that error appears in the above-identified patent and that said Letters Patent is hereby corrected as shown below:

The Title page, showing an illustrative figure, should be deleted and substitute therefor the attached Title page.

In the drawings:
      In FIG. 3,           insert reference numeral --260-- and associated lead line with arrow, located on the right side of the drawing.

Replace FIG. 3 with the following amended figure:

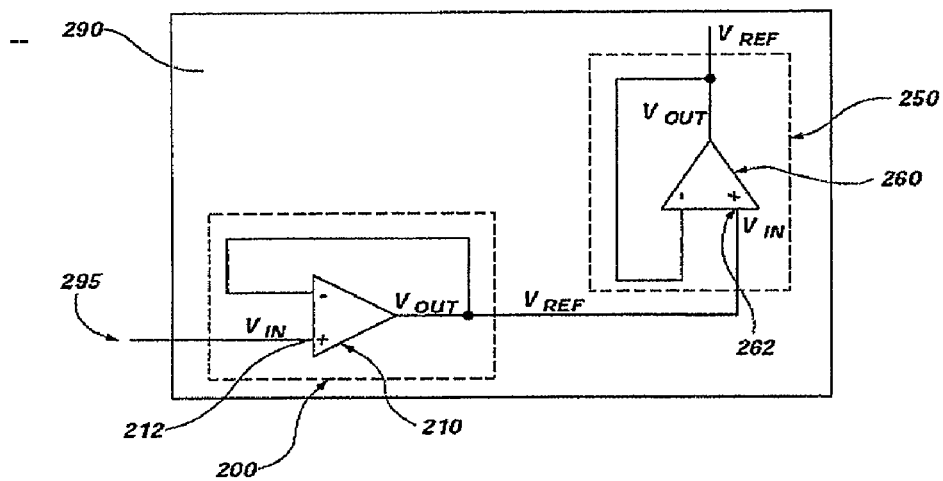

Fig. 3

Signed and Sealed this

Twentieth Day of November, 2007

JON W. DUDAS
*Director of the United States Patent and Trademark Office*

(12) United States Patent
Stubbs et al.

(10) Patent No.: US 6,898,144 B2
(45) Date of Patent: May 24, 2005

(54) ACTIVELY DRIVEN VREF FOR INPUT BUFFER NOISE IMMUNITY

(75) Inventors: Eric T. Stubbs, Boise, ID (US); James E. Miller, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/624,772

(22) Filed: Jul. 22, 2003

(65) Prior Publication Data
US 2004/0120205 A1 Jun. 24, 2004

Related U.S. Application Data

(63) Continuation of application No. 09/759,499, filed on Jan. 12, 2001, now Pat. No. 6,597,619.

(51) Int. Cl.⁷ .................................................. G11C 7/00
(52) U.S. Cl. ............ 365/226; 365/185.21; 365/189.07; 365/206; 365/207
(58) Field of Search ..................... 365/226, 185.21, 365/189.07, 206, 207

(56) References Cited
U.S. PATENT DOCUMENTS

| | | |
|---|---|---|
| 4,006,400 A | 2/1977 | Pell et al. |
| 4,110,677 A | 8/1978 | Boronkay et al. |
| 4,270,090 A | 5/1981 | Williams et al. |
| 4,399,398 A | 8/1983 | Wittlinger |
| 4,477,736 A | 10/1984 | Onishi |
| 4,559,486 A | 12/1985 | Minakuchi |
| 4,714,845 A | 12/1987 | Devecchi et al. |
| 5,212,460 A | 5/1993 | Walter |
| 5,444,663 A * | 8/1995 | Furuno et al. ............ 365/226 |
| 5,453,713 A | 9/1995 | Partovi et al. |
| 5,481,179 A | 1/1996 | Keeth |
| 5,721,702 A | 2/1998 | Briner |
| 5,796,295 A | 8/1998 | Sharpe-Geisler |
| 5,892,402 A | 4/1999 | Tsubaki et al. |
| 5,973,897 A | 10/1999 | Opris et al. |
| 6,124,704 A * | 9/2000 | Annema ............ 323/313 |
| 6,236,195 B1 | 5/2001 | Nagatomo |
| 6,294,941 B1 | 9/2001 | Yokosawa |
| 6,339,357 B1 | 1/2002 | Yamasaki et al. |
| 6,396,336 B2 | 5/2002 | Roberts et al. |

* cited by examiner

*Primary Examiner*—Connie C. Yoha
(74) *Attorney, Agent, or Firm*—TraskBritt

(57) ABSTRACT

A memory device including a circuit for actively driving a reference voltage in a memory device is disclosed. A circuit integrated in a memory device and coupled to an external voltage source substantially eliminates fluctuations in the reference voltage of the memory device caused by power supply changes and noise occurring in the memory device by generating a constant voltage and good current drive from the external voltage source.

8 Claims, 3 Drawing Sheets